United States Patent
Wakabayashi et al.

(10) Patent No.: US 10,437,657 B2
(45) Date of Patent: Oct. 8, 2019

(54) SUPPORT SYSTEM AND NON-TRANSITORY COMPUTER READABLE MEDIUM

(71) Applicant: FUJI XEROX CO., LTD., Tokyo (JP)

(72) Inventors: Kimihiro Wakabayashi, Kanagawa (JP); Yoshikazu Okamoto, Kanagawa (JP); Hiroshi Murano, Kanagawa (JP); Yasuaki Miyazawa, Kanagawa (JP); Mari Horie, Kanagawa (JP); Nobukazu Takahashi, Kanagawa (JP); Makoto Fuchigami, Kanagawa (JP); Masao Okubo, Kanagawa (JP)

(73) Assignee: FUJI XEROX CO., LTD., Tokyo (JP)

(*) Notice: Subject to any disclaimer, the term of this patent is extended or adjusted under 35 U.S.C. 154(b) by 9 days.

(21) Appl. No.: 15/715,987

(22) Filed: Sep. 26, 2017

(65) Prior Publication Data

US 2018/0232271 A1     Aug. 16, 2018

(30) Foreign Application Priority Data

Feb. 14, 2017 (JP) ................. 2017-025045

(51) Int. Cl.
*G06F 11/00*     (2006.01)
*G06F 11/07*     (2006.01)
(Continued)

(52) U.S. Cl.
CPC ...... *G06F 11/0736* (2013.01); *G06F 17/2735* (2013.01); *G06F 17/50* (2013.01); *G06K 9/6267* (2013.01)

(58) Field of Classification Search
CPC .. G06F 11/008; G06F 11/079; G06F 11/3409; G06F 11/3452; G06F 11/3604
(Continued)

(56) References Cited

U.S. PATENT DOCUMENTS

| 8,209,212 B2 | 6/2012 | Araki et al. |
| 2014/0052644 A1* | 2/2014 | Ott .................. G06Q 10/10 705/304 |

(Continued)

FOREIGN PATENT DOCUMENTS

| JP | 4104622 B2 | 6/2008 |
| JP | 4705141 B2 | 6/2011 |

(Continued)

*Primary Examiner* — Sarai E Butler
(74) *Attorney, Agent, or Firm* — Oliff PLC

(57) ABSTRACT

A design support system includes a storage unit, an accepting unit, a selecting unit, and an associating unit. The storage unit stores information regarding design element classifications into which design elements constituting a product are classified and design requirement classifications into which design requirements required for the product are classified. The accepting unit accepts technical information regarding a trouble due to design. The selecting unit refers to the technical information regarding the trouble, selects a classification item to which the trouble belongs from among the design requirement classifications, and selects a classification item to which a design element that has caused the trouble belongs from among the design element classifications. The associating unit associates the classification item of the design requirement classifications with the classification item of the design element classifications with regard to the design element classifications and the design requirement classifications stored in the storage unit.

20 Claims, 13 Drawing Sheets

(51) Int. Cl.
*G06K 9/62* (2006.01)
*G06F 17/27* (2006.01)
*G06F 17/50* (2006.01)

(58) Field of Classification Search
USPC .......................................................... 714/37
See application file for complete search history.

(56) References Cited

U.S. PATENT DOCUMENTS

2015/0121452 A1* 4/2015 Koizumi ................ G06F 21/57
726/1
2015/0356504 A1* 12/2015 Lohmueller ............ G06F 16/60
705/29

FOREIGN PATENT DOCUMENTS

JP        2015-064847 A    4/2015
JP        2016-042214 A    3/2016

* cited by examiner

FIG. 4

| LARGE CLASSIFICATION | MEDIUM CLASSIFICATION | SMALL CLASSIFICATION |
|---|---|---|
| MECHANICAL PART | HOUSING | METAL HOUSING |
| | | PLASTIC HOUSING |
| | GEAR | CUT SPUR GEAR |
| | | SINTERED SPUR GEAR |
| | | HELICAL GEAR |
| | | WORM GEAR |
| | | BEVEL GEAR |
| | SEAL | POLYIMIDE SEAL |
| | | URETHANE SEAL |
| | | O-RING |
| | ⋮ | ⋮ |
| | BEARING | BALL BEARING |
| | | SINTERED BEARING |
| | | PLASTIC BEARING |
| ELECTRICAL PART | MOTOR | AC MOTOR |
| | | DC MOTOR |
| | | STEPPING MOTOR |
| ⋮ | ⋮ | ⋮ |

FIG. 5

| PRIMARY FUNCTION | SECONDARY FUNCTION | REQUIREMENT SPECIFICATION TO BE SATISFIED |
|---|---|---|
| IMAGE FORMING PROCESS | DEVELOPMENT PROCESS | PERFORMANCE A/ EVALUATION △△ OR HIGHER |
| | | PERFORMANCE B/ EVALUATION □□ OR HIGHER |
| | FUSING PROCESS | DEGREE OF FIXITY/ EVALUATION STANDARD GRADE 8 OR HIGHER |
| | | PERFORMANCE C/ EVALUATION ○○ OR HIGHER |
| | ⋮ | ⋮ |
| | OTHERS | NO UNUSUAL HEAT GENERATION AT MOTOR |
| | | PRINT SPEED/ 40 PPM OR HIGHER |
| | | NO FORM JAM |
| | | NO OPERATING SOUND/ UNUSUAL SOUND |
| IMAGE READING PROCESS | ⋮ | ⋮ |

FIG. 6

TROUBLE REPORT

- TROUBLE NAME: FUSING FAILURE

- RELATED PARTS: LEVER ASSY (0123AB007), PRESSURE ROLL (0003C0147)

- CAUSES: PRESSURE POWER WAS INSUFFICIENT, AND FUSING FAILURE WAS CAUSED. DESIGN FAILURE.

- MEASURES: PRESSURE POWER WAS CHANGED. LENGTH OF SPRING INSIDE LEVER ASSY WAS CHANGED FROM 6 mm TO 5.5 mm.
AS A RESULT, FORM PRESSURE POWER WAS CHANGED FROM 10 kgf/cm$^2$ TO 12 kgf/cm$^2$.

NOTE THAT IT IS DETERMINED THAT PRESSURE-ROLL EXTERNAL DIAMETER CHANGE MEASURE WILL NOT BE TAKEN TO PRIORITIZE COMMONALITY OF PARTS WITH OTHER MODELS.

FIG. 7

| TROUBLE CLASSIFICATION NAME | RELATED-TERM EXPRESSION | | | | |
|---|---|---|---|---|---|
| FORM JAM | JAM | PAPER JAM | FORM JAMMING | PAPER JAMMING | ... |
| ABNORMAL SOUND | NOISE | HUM | RATTLY | CLUNKY | ... |
| ABNORMAL HEAT GENERATION | OVERHEATING | BURN | HEAT GENERATION | HOT | ... |
| ... | ... | ... | ... | ... | ... |

FIG. 8

| TROUBLE NAME | REQUIREMENT SPECIFICATION TO BE SATISFIED |
|---|---|
| PERFORMANCE A FAILURE | PERFORMANCE A/ EVALUATION △△ OR HIGHER |
| PERFORMANCE B FAILURE | PERFORMANCE B/ EVALUATION □□ OR HIGHER |
| FUSING FAILURE | DEGREE OF FIXITY/ EVALUATION STANDARD GRADE 8 OR HIGHER |
| PERFORMANCE C FAILURE | PERFORMANCE C/ EVALUATION ○○ OR HIGHER |
| ⋮ | ⋮ |
| UNUSUAL HEAT GENERATION AT MOTOR | NO UNUSUAL HEAT GENERATION AT MOTOR |
| PRINT SPEED FAILURE | PRINT SPEED/ 40 PPM OR HIGHER |
| FORM JAM | NO FORM JAM |
| ABNORMAL OPERATION SOUND | NO OPERATING SOUND/ UNUSUAL SOUND |
| ⋮ | ⋮ |

FIG. 10

| DESIGN SPECIFICATION LIST | | |
|---|---|---|
| PRIMARY FUNCTION | SECONDARY FUNCTION | REQUIREMENT SPECIFICATION TO BE SATISFIED |
| ... | ... | PERFORMANCE A/ EVALUATION △△ OR HIGHER |
| | | ... |
| ... | ... | DEGREE OF FIXITY/ EVALUATION STANDARD GRADE 8 OR HIGHER |
| | | ... |
| | ... | PRINT SPEED/ 40 PPM OR HIGHER |
| | | NO FORM JAM |
| | | NO OPERATING SOUND/ UNUSUAL SOUND |

ASSOCIATED

| PART CLASSIFICATIONS | | |
|---|---|---|
| SMALL CLASSIFICATION | MEDIUM CLASSIFICATION | LARGE CLASSIFICATION |
| ... | ... | ... |
| LEVER ASSY/ PRESSURE POWER **kgf | | |
| ... | | |
| PRESSURE ROLL/ EXTERNAL DIAMETER **mm | | |
| ... | | |
| *** MOTOR | | |
| ... | | |
| *** GEAR | | |
| ... | | |
| *** ASSY | | |
| ... | | |

FIG. 11

| SEARCH FOR PAST TROUBLE CASES | | | ☒ |
|---|---|---|---|
| SELECTED PART NAME | | DC MOTOR | |

| PAST TROUBLE CASES | | |
|---|---|---|
| 1 | MOTOR FAIL | 23 CASES |
| 2 | ABNORMAL SOUND | 17 CASES |
| 3 | HEATING | 9 CASES |
| 4 | OTHERS | 3 CASES |

SEARCH  CANCEL

FIG. 12

| SEARCH FOR PAST TROUBLE CASES | | | ☒ |
|---|---|---|---|
| SELECTED REQUIREMENT SPECIFICATION (TROUBLE CLASSIFICATION NAME): | | PRINT SPEED (PRINT SPEED FAILURE) | |

| CLASSIFICATION NAMES OF PARTS THAT ARE CAUSES | | |
|---|---|---|
| 1 | *** MOTOR | 43 CASES |
| 2 | *** GEAR | 29 CASES |
| 3 | *** ASSY | 7 CASES |
| 4 | OTHERS | 1 CASE |

[SEARCH] [CANCEL]

SUPPORT SYSTEM AND NON-TRANSITORY COMPUTER READABLE MEDIUM

CROSS-REFERENCE TO RELATED APPLICATIONS

This application is based on and claims priority under 35 USC 119 from Japanese Patent Application No. 2017-025045 filed Feb. 14, 2017.

BACKGROUND

Technical Field

The present invention relates to a design support system and a non-transitory computer readable medium.

SUMMARY

According to an aspect of the invention, there is provided a design support system including a storage unit, an accepting unit, a selecting unit, and an associating unit. The storage unit stores information regarding design element classifications into which design elements constituting a product are classified and design requirement classifications into which design requirements required for the product are classified. The accepting unit accepts technical information regarding a trouble due to design. The selecting unit refers to the technical information regarding the trouble due to the design accepted by the accepting unit, selects a classification item to which the trouble due to the design belongs from among the design requirement classifications, and selects a classification item to which a design element that has caused the trouble due to the design belongs from among the design element classifications. The associating unit associates the classification item of the design requirement classifications with the classification item of the design element classifications with regard to the design element classifications and the design requirement classifications stored in the storage unit, the classification items having been selected by the selecting unit.

BRIEF DESCRIPTION OF THE DRAWINGS

An exemplary embodiment of the present invention will be described in detail based on the following figures, wherein:

FIG. 4 is a diagram for describing an example of part classifications stored in a design information database;

FIG. 5 is a diagram for describing an example of a design specification list stored in the design information database;

FIG. 6 is a diagram for describing an example of a trouble report;

FIG. 7 is a diagram for describing an example of a related-term expression dictionary for trouble classification names;

FIG. 8 is a diagram for describing an example of a trouble name-requirement specification correspondence table;

FIG. 10 is a diagram for describing the way in which the design information management unit sequentially associates requirement specification items with part classification items;

FIG. 11 is a diagram for describing the way in which, in the case where a part classification called "DC motor" is selected and a search for the part classification is performed, a list of trouble classification names (requirement specification names) associated with the part classification is displayed;

FIG. 12 is a diagram for describing the way in which, in the case where a requirement specification (a trouble classification) called print speed (print speed failure) is selected and a search for the requirement specification is performed, a list of classification item names of parts that have caused the case where the requirement specification is not satisfied is displayed.

DETAILED DESCRIPTION

Next, an exemplary embodiment of the present invention will be described in detail with reference to the drawings.

Figure 1:
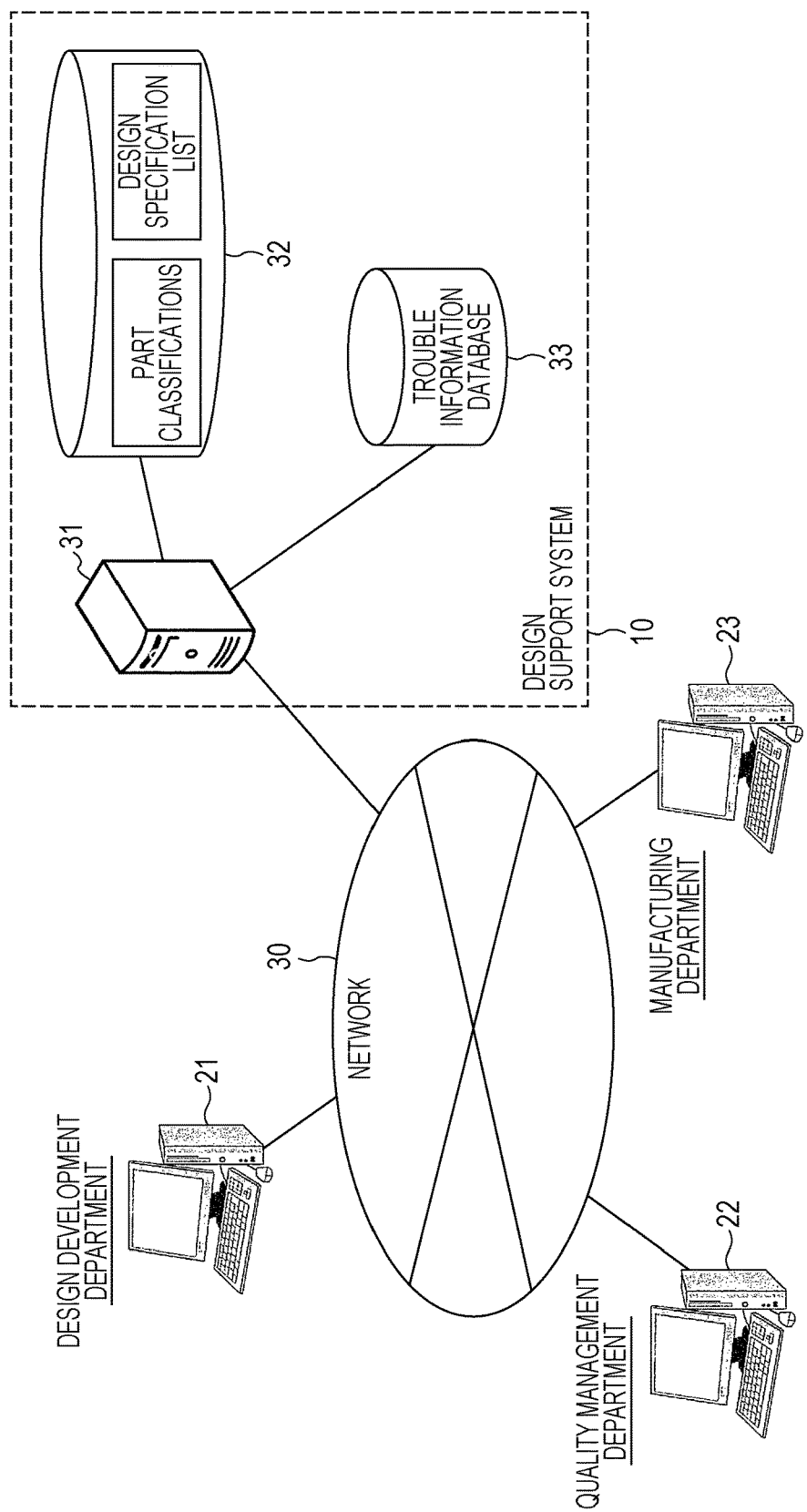
FIG. 1 is a diagram illustrating the configuration of the entire system including a design support system according to an exemplary embodiment of the present invention.

FIG. 1 is a diagram illustrating the configuration of the entire system including a design support system 10 according to the exemplary embodiment of the present invention.

The design support system 10 according to the exemplary embodiment of the present invention is connected to terminal apparatuses 21 to 23 via a network 30 as illustrated in FIG. 1. Here, the terminal apparatuses 21 to 23 are installed in a design development department, a quality management department, and a manufacturing department, respectively. Note that, for the sake of brevity, the present exemplary embodiment is described assuming that only three terminal apparatuses 21 to 23 are connected to the design support system 10; however, in actuality many terminal apparatuses are connectable to the design support system 10.

The design support system 10 includes a management server 31, a design information database 32, and a trouble information database 33.

The design information database 32 stores part classifications (design element classifications) into which parts (design elements) constituting a product are classified, and a design specification list (design requirement classifications) obtained by classifying design specifications (design requirements) required for this product. Note that the part classifications and the design specification list will be described in detail later.

The trouble information database 33 stores various types of technical information regarding for example trouble reports describing the content of trouble cases that have occurred in the market, market service documents describing methods for handling troubles in the market, and technical guidelines. These pieces of technical information regarding troubles due to design (hereinafter referred to as "design troubles") are input to the terminal apparatuses 21 to 23 in the design development department, the quality management department, and the manufacturing department, and are stored in the trouble information database 33 via the management server 31 of the design support system 10.

Figure 2:
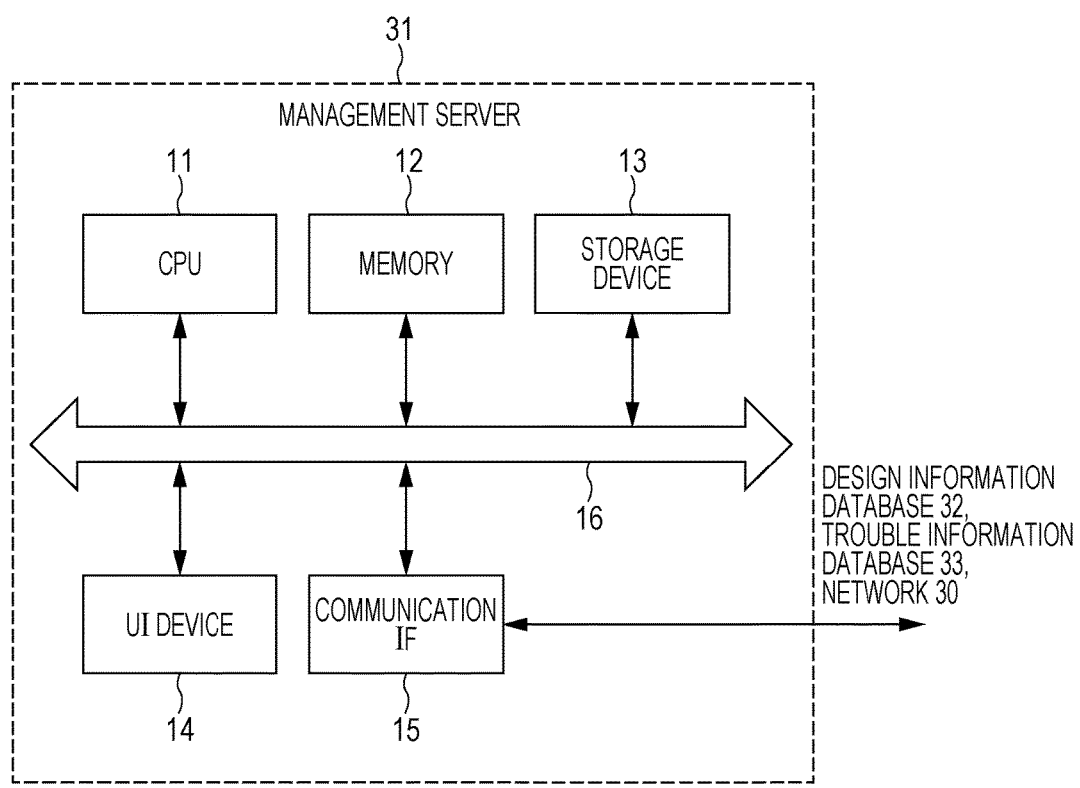
FIG. 2 is a block diagram illustrating a hardware configuration of a management server in the design support system according to the exemplary embodiment of the present invention.

Next, FIG. 2 illustrates a hardware configuration of the management server 31 in the design support system 10 according to the present exemplary embodiment.

As illustrated in FIG. 2, the management server 31 includes a central processing unit (CPU) 11, a memory 12, a storage device 13 such as a hard disk drive (HDD), a user interface (UI) device 14, and a communication interface (IF) 15 that transmits and receives data to and from external apparatuses such as the terminal apparatuses 21 to 23 via the design information database 32, the trouble information database 33, and the network 30. These constituent elements are connected to each other via a control bus 16.

The CPU 11 controls an operation of the management server 31 by executing a predetermined process on the basis of a control program stored in the memory 12 or the storage device 13. Note that the CPU 11 has been described to read out and execute the control program stored in the memory 12 or storage device 13 in the present exemplary embodiment; however, the program may be stored in a storage medium such as a CD-ROM and supplied to the CPU 11.

Figure 3:
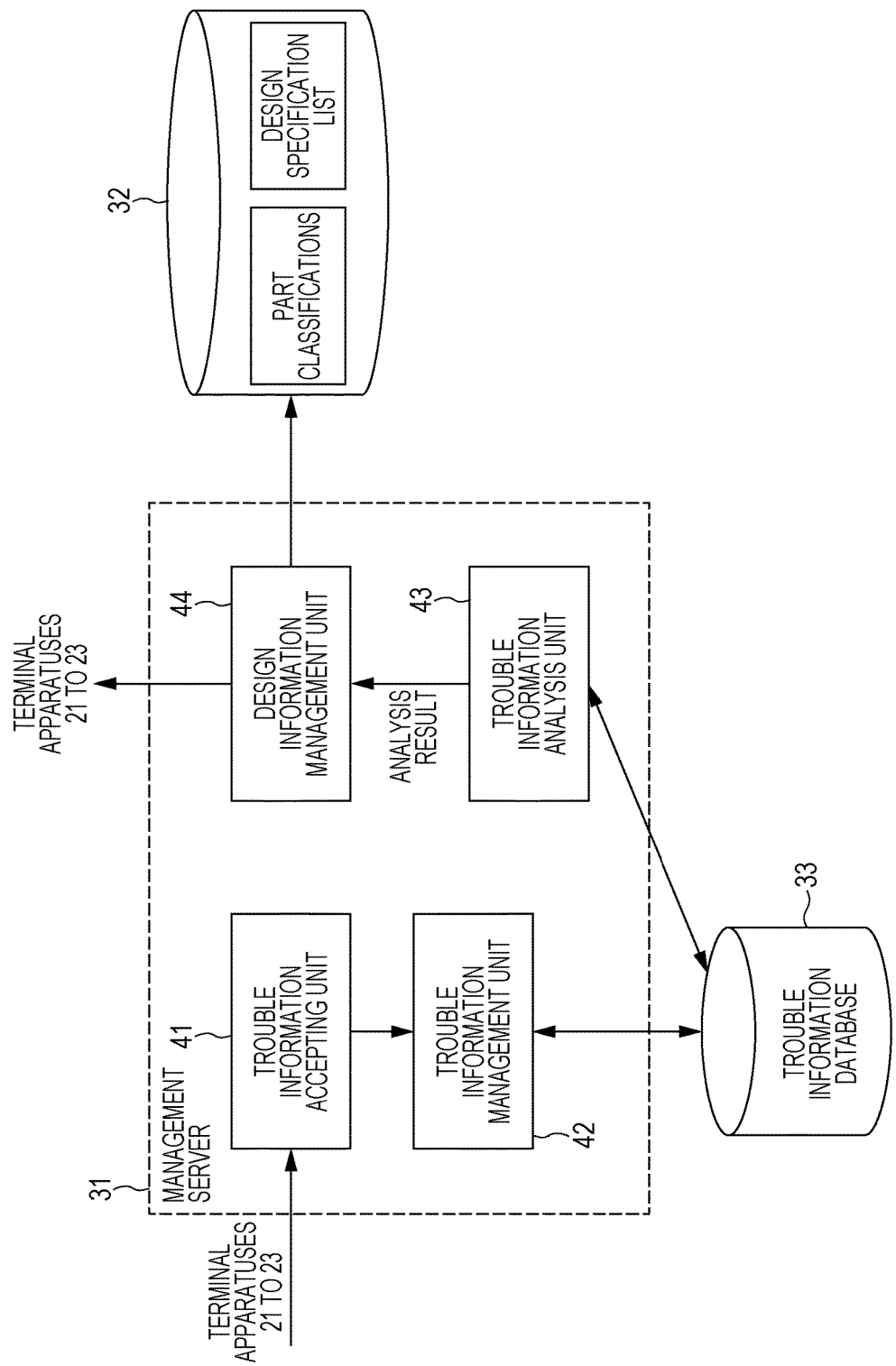
FIG. 3 is a block diagram illustrating a functional configuration of the management server in the design support system according to the exemplary embodiment of the present invention.

FIG. 3 is a block diagram illustrating a functional configuration of the management server 31 realized when the control program above is executed.

As illustrated in FIG. 3, the management server 31 according to the present exemplary embodiment includes a trouble information accepting unit 41, a trouble information management unit 42, a trouble information analysis unit 43, and a design information management unit 44, and manages the design information database 32 and the trouble information database 33.

The design information database 32 according to the present exemplary embodiment stores the part classifications into which the parts constituting the product are classified, and the design specification list obtained by classifying requirement specifications (design requirements) of the product.

An example of the part classifications will be described with reference to FIG. 4. In an example of a part classification table illustrated in FIG. 4, parts constituting a product such as an image forming apparatus are hierarchically classified into large, medium, and small classifications. The small classifications, which are the smallest classification, have part classification names, and classification is performed into for example "metal housing" and "plastic housing".

Note that FIG. 4 illustrates the parts simply using their part classification names for the sake of brevity; however, the parts are specifically classified in accordance with part numbers and part attributes, characteristics, and so on in an actual part classification table. Specifically, each classification item of the part classifications has information regarding attribute values such as a weight, a length, a material standard number, and a maximum input voltage and a corresponding part number, and furthermore the part number is associated with information such as a drawing, a purchase cost, and market quality.

Next, FIG. 5 illustrates an example of the design specification list stored in the design information database 32. FIG. 5 illustrates the design specification list illustrating classified requirement specifications required for a so-called multifunction machine having multiple functions such as a print function, a scan function, a copy function, and a facsimile function. Specifically, various requirement specifications such as the degree of fixity, a print speed, and operating noise in a fusing process are illustrated in a list format.

The trouble information accepting unit 41 accepts technical information regarding design troubles input to the terminal apparatuses 21 to 23 in various departments such as the design development department, the quality management department, and the manufacturing department.

FIG. 6 illustrates an example of a trouble report that is a piece of such technical information.

It is clear from the example of the trouble report illustrated in FIG. 6 that a trouble name "fusing failure", information such as the names and product numbers of associated parts that are parts associated with this trouble, and information such as the content of the trouble and measures taken for the trouble are described.

The trouble information management unit 42 stores, as trouble information in the trouble information database 33, technical information regarding such a design trouble and accepted by the trouble information accepting unit 41 and manages the trouble information.

The trouble information analysis unit 43 analyzes, by performing natural language analysis processing such as text mining on the technical information regarding the design trouble and stored in the trouble information database 33, the content of the design trouble and design elements that have caused the design trouble described in the technical information.

Specifically, the trouble information analysis unit 43 stores a related-term dictionary in which multiple related terms (synonyms) obtained by expressing the same classification item in different words are collected. When performing a natural language analysis on the technical information regarding the design trouble, the trouble information analysis unit 43 analyzes, using the related-term dictionary, the content of the design trouble and the design elements that have caused the design trouble.

For example, even in the case where a name "form jam" is registered as a trouble classification name, a trouble event may be described in various terms such as "jam", "jamming", "paper jam", "paper jamming", "form jamming", and "form transport failure" in an actual trouble report and the like.

Thus, as illustrated in FIG. 7, a related-term expression dictionary regarding trouble classification names is prepared in advance, and the trouble information analysis unit 43 analyzes a trouble classification item in a technical document such as a trouble report with reference to such a related-term expression dictionary.

Likewise, regarding part names, even in the case where a part classification name "fusing roll" is registered, a part name may be described in various terms such as "fusing roller", "heating roll", "heating roller", "fixing unit", "fixing roller", and "fixing roll" in an actual trouble report or the like.

A related-term expression dictionary for part classification names is also prepared in advance, and is made usable when the trouble information analysis unit 43 analyzes a part that has caused a trouble from the technical document such as the trouble report.

With reference to the technical information regarding the design trouble accepted by the trouble information accepting unit 41 and stored in the trouble information database 33, the design information management unit 44 selects a classification item to which this design trouble belongs from the design specification list (design requirement classifications), and selects a classification item to which the part (design element) that has caused the design trouble belongs from among the part classifications.

Specifically, the design information management unit 44 selects, on the basis of an analysis result from the trouble information analysis unit 43, a classification item to which the design trouble belongs from the design specification list, and selects a classification item to which the part that has caused the design trouble from among the part classifications.

The design information management unit 44 then associates the selected classification item of the design specification list with the selected classification item of the part classifications with regard to the part classifications and the design specification list stored in the design information database 32.

Note that design requirements required to design a certain product are very closely related to design troubles that are malfunctions due to the design. That is, when a certain design requirement is not satisfied, this may leads to a design trouble.

The design specification list is used as design requirement classifications in the present exemplary embodiment; however, not design requirement items but trouble names are generally described in an actual trouble report or the like. Thus, even when a trouble report or the like is analyzed, the analysis may not directly be linked to a classification item of the design requirements.

In the present exemplary embodiment, the design information management unit 44 stores in advance a trouble name-requirement specification correspondence table as illustrated in FIG. 8, the trouble name-requirement specification correspondence table illustrating relationships between trouble names and the requirement specifications, and performs processing for converting the trouble name obtained from the trouble report or the like into a requirement specification.

For example, with reference to the trouble name-requirement specification correspondence table, it is clear that the trouble name "fusing failure" corresponds to "degree of fixity" as a requirement specification to be satisfied.

In addition, the design information management unit 44 links, to each other, the technical document such as the trouble report, the classification item of the part classifications, and the classification item of the design specification list, the classification items being associated with each other.

In addition, when the part classifications are searched for a classification item of a certain part, the design information management unit 44 outputs the classification item of the part for which the search has been performed and classification items of the design specification list associated with the classification item of the part for which the search has been performed. In this case, the design information management unit 44 outputs the classification items of the design specification list in descending order of the number of design trouble occurrences.

Furthermore, when the design specification list is searched for a certain classification item of the design specifications, the design information management unit 44 outputs the classification item for which the search has been performed and classification items of the part classifications associated with the classification item of the design specifications for which the search has been performed.

Figure 9:
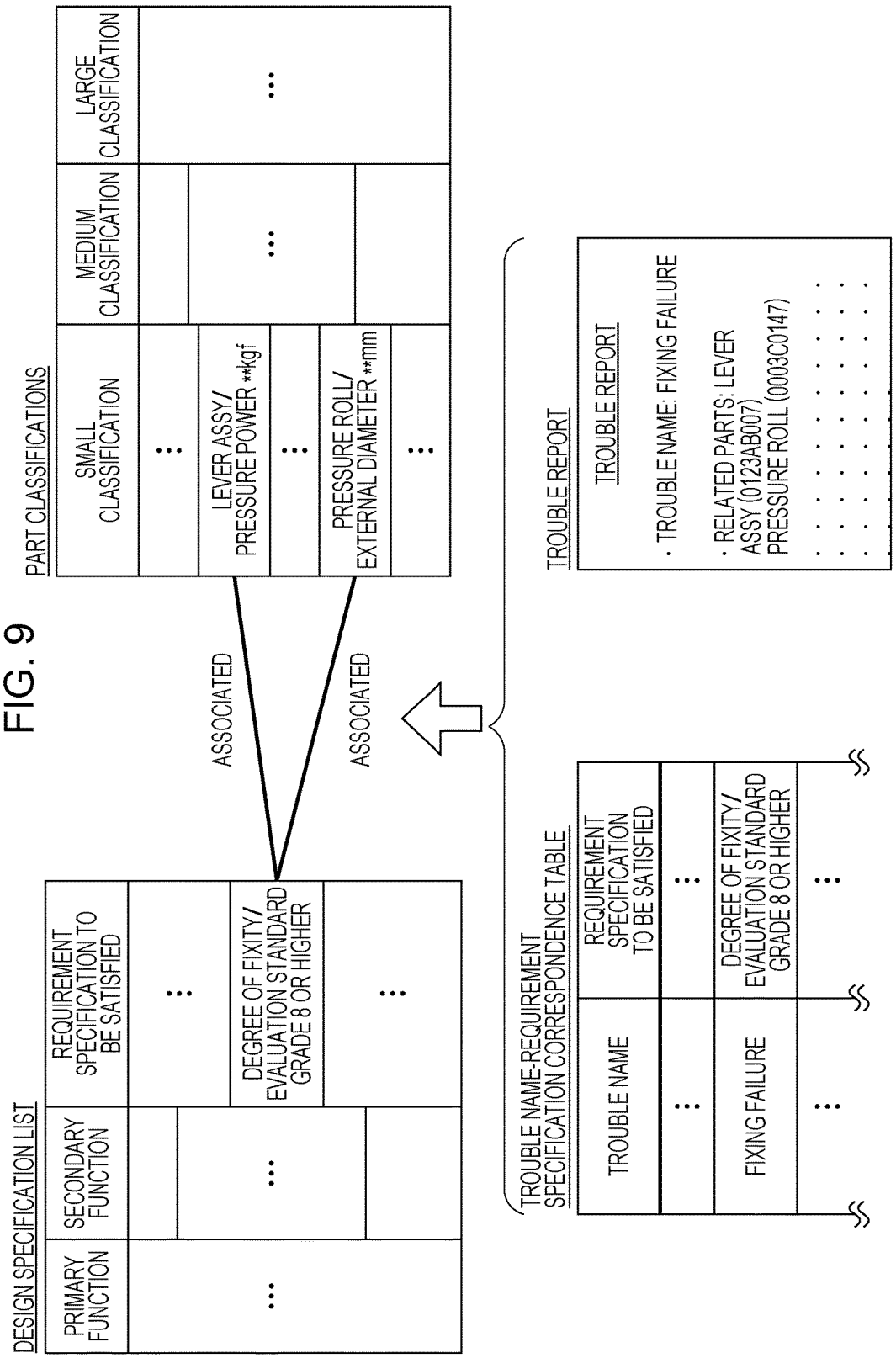
FIG. 9 is a diagram for describing the way in which a design information management unit associates, using the trouble report and the trouble name-requirement specification correspondence table, a requirement specification item of the design specification list with classification items of the part classifications.

The design information management unit 44 executes processing for associating a requirement specification item of the design specification list with classification items of the part classifications as illustrated in FIG. 9 using, as described above, the technical document such as the trouble report accepted by the trouble information accepting unit 41 and the trouble name-requirement specification correspondence table illustrated in FIG. 8.

In the specific example illustrated in FIG. 9, the trouble report is related to "fusing failure" and parts related to this design trouble are "lever ASSY" and "pressure roll", and it is clear in FIG. 9 that the item "degree of fixity" of the design specification list is associated with items "lever ASSY" and "pressure roll" in the part classifications.

In addition, regarding data of this trouble report, the design information management unit 44 performs registration such that the requirement specification item "degree of fixity" may be linked to the part classification items "lever ASSY" and "pressure roll", and the part classification items "lever ASSY" and "pressure roll" may be linked to the requirement specification item "degree of fixity".

As illustrated in FIG. 10, the design information management unit 44 then sequentially associate requirement specification items with part classification items about technical documents regarding the design trouble stored in the trouble information database 33.

Specifically, in the case where for example a certain classification item is selected from among the part classifications in accordance with an operation by the terminal apparatuses 21 to 23, the design information management unit 44 outputs, using the linkage as described above, a list of requirement specification items (trouble classification items) associated with the selected classification item.

For example, as illustrated in FIG. 11, when a part classification called "DC motor" is selected and a search for the part classification is performed, a list of trouble classification names (requirement specification names) associated with the part classification such as "motor fail", "abnormal sound", "heating", and "others" is displayed. In this list of trouble classification names, trouble items with more registered trouble cases are arranged at higher ranks.

In addition, for example, as illustrated in FIG. 12, when a requirement specification (a trouble classification) called print speed (print speed failure) is selected and a search for the requirement specification is performed, a list of classification item names of parts that are causes, such as "* motor", "* gear", "***ASSY", and "others", of the case where the requirement specification is not satisfied (classification item names of parts that have caused the design trouble) is displayed. In the list of classification item names of parts, too, part classification items with more registered trouble cases are arranged at higher ranks.

In addition, the list illustrated in FIG. 11 indicates 23 cases as a search result for "motor fail". The 23 cases are individual trouble cases associated by the design information management unit 44, and thus each case may be read out as a specific case. Likewise, with the list illustrated in FIG. 12, 43 cases as a search result for "*** motor" may be individually read out for reference or further use.

Note that the case where the design requirement classifications are a list of design specifications illustrating the design specification list required for this product has been described in the exemplary embodiment above; however, the design requirement classifications may be trouble classifications obtained by classifying design troubles that have occurred in the product.

As a result of use of the trouble classifications as the design requirement classifications in this manner, the trouble name-requirement specification correspondence table as illustrated in FIG. 8 becomes unnecessary.

Figure 13:
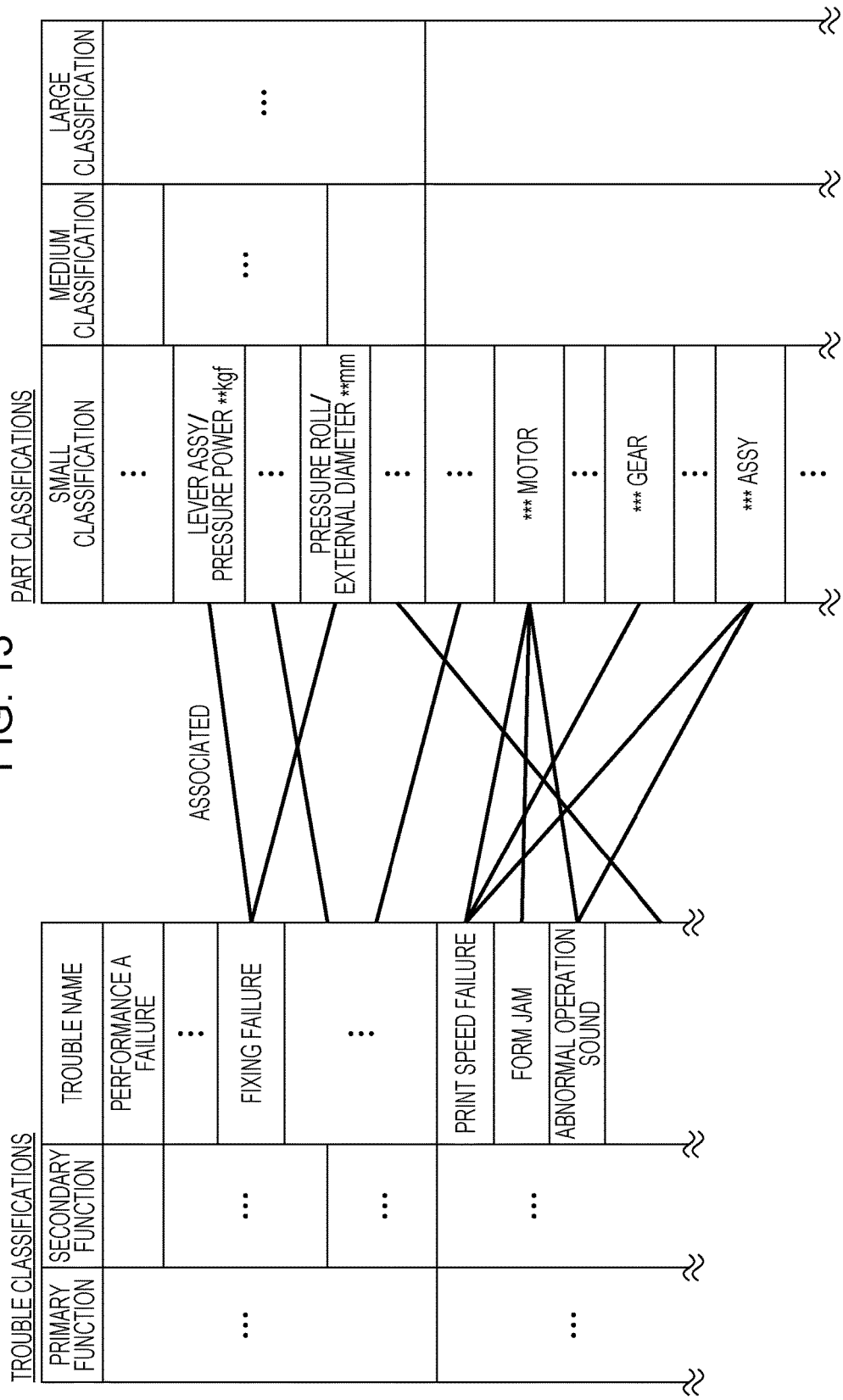
FIG. 13 is a diagram for describing the way in which, in the case where trouble classifications are used as design requirement classifications, classification items of the trouble classifications are associated with classification items of the part classifications.

In such a case, as illustrated in FIG. 13, the design information management unit 44 refers to the technical information regarding a design trouble stored in the trouble information database 33, selects a classification item to which the design trouble belongs from among the trouble classifications, selects a classification item to which a part that has caused the design trouble belongs from among the part classifications, and associates the selected classification item of the trouble classifications with the selected classification item of the part classifications.

Note that in the trouble classifications, each classification item has attribute information such as a model, a subsystem, a department in charge, and causes.

The foregoing description of the exemplary embodiment of the present invention has been provided for the purposes of illustration and description. It is not intended to be exhaustive or to limit the invention to the precise forms disclosed. Obviously, many modifications and variations will be apparent to practitioners skilled in the art. The embodiment was chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A support system comprising: a management server that includes a central processing unit (CPU); a storage unit that stores information regarding element classifications into which elements constituting a product are classified and requirement classifications into which requirements required for the product are classified; an accepting unit that accepts technical information regarding a trouble; a selecting unit that refers to the technical information regarding the trouble accepted by the accepting unit, selects a classification item to which the trouble belongs from among the requirement classifications, and selects a classification item to which an element that has caused the trouble belongs from among the element classifications; and an associating unit that associates the classification item of the requirement classifications with the classification item of the element classifications with regard to the element classifications and the requirement classifications stored in the storage unit, the classification item having been selected by the selecting unit.

2. The support system according to claim 1, further comprising: an analysis unit that analyzes, by performing a natural language analysis on the technical information regarding the trouble, content of the trouble and the element that has caused the trouble, wherein the selecting unit selects, based on an analysis result from the analysis unit, the classification item to which the trouble belongs from among the requirement classifications and selects the classification item to which the element that has caused the trouble belongs from among the element classifications.

3. The support system according to claim 2, wherein the analysis unit stores a related-term dictionary in which a plurality of related terms obtained by expressing the classification item in different words are collected, and analyzes, using the related-term dictionary, content of the trouble and the element that has caused the trouble in a case where the natural language analysis is performed on the technical information regarding the trouble.

4. The support system according to claim 1, further comprising: an output unit that outputs, in a case where the element classifications are searched for a classification item of a certain element, the classification item of the element for which the search has been performed and a classification item of the requirement classifications associated with the classification item of the element for which the search has been performed.

5. The support system according to claim 2, further comprising: an output unit that outputs, in a case where the element classifications are searched for a classification item of a certain element, the classification item of the element for which the search has been performed and a classification item of the requirement classifications associated with the classification item of the element for which the search has been performed.

6. The support system according to claim 3, further comprising: an output unit that outputs, in a case where the element classifications are searched for a classification item of a certain element, the classification item of the element for which the search has been performed and a classification item of the requirement classifications associated with the classification item of the element for which the search has been performed.

7. The support system according to claim 4, wherein the output unit outputs classification items of the requirement classifications in descending order of a number of occurrences of the trouble.

8. The support system according to claim 5, wherein the output unit outputs classification items of the requirement classifications in descending order of a number of occurrences of the trouble.

9. The support system according to claim 6, wherein the output unit outputs classification items of the requirement classifications in descending order of a number of occurrences of the trouble.

10. The support system corresponding to claim 4, wherein the output unit outputs, in a case where the requirement classifications are searched for a classification item of a certain requirement, the classification item of the certain requirement for which the search has been performed and a classification item of the element classifications associated with the classification item of the certain requirement for which the search has been performed.

11. The support system corresponding to claim 5, wherein the output unit outputs, in a case where
   the requirement classifications are searched for a classification item of a certain requirement, the classification item of the certain requirement for which the search has been performed and a classification item of the element classifications associated with the classification item of the requirement for which the search has been performed.

12. The support system corresponding to claim 6, wherein the output unit outputs, in a case where
   the requirement classifications are searched for a classification item of a certain requirement, the classification item of the certain requirement for which the search has been performed and a classification item of the element classifications associated with the classification item of the certain requirement for which the search has been performed.

13. The support system corresponding to claim 7, wherein the output unit outputs, in a case where
   the requirement classifications are searched for a classification item of a certain requirement, the classification item of the certain requirement for which the search has been performed and a classification item of the element classifications associated with the classification item of the certain requirement for which the search has been performed.

14. The support system corresponding to claim 8, wherein the output unit outputs, in a case where
the requirement classifications are searched for a classification item of a certain requirement, the classification item of the certain requirement for which the search has been performed and a classification item of the element classifications associated with the classification item of the certain requirement for which the search has been performed.

15. The support system corresponding to claim 9, wherein the output unit outputs, in a case where
the requirement classifications are searched for a classification item of a certain requirement, the classification item of the certain requirement for which the search has been performed and a classification item of the element classifications associated with the classification item of the certain requirement for which the search has been performed.

16. The support system according to claim 1, wherein the element classifications are part classifications into which parts constituting the product are classified, and the requirement classifications are a specification list illustrating a list of specifications required for the product.

17. The support system according to claim 2, wherein the element classifications are part classifications into which parts constituting the product are classified, and the requirement classifications are a specification list illustrating a list of specifications required for the product.

18. The support system according to claim 1, wherein the element classifications are part classifications into which parts constituting the product are classified, and the requirement classifications are trouble classifications into which troubles that have occurred in the product are classified.

19. The support system according to claim 2, wherein the element classifications are part classifications into which parts constituting the product are classified, and the requirement classifications are trouble classifications into which troubles that have occurred in the product are classified.

20. A non-transitory computer readable medium storing a program causing a computer to execute a process, the process comprising: storing information regarding element classifications into which elements constituting a product are classified and requirement classifications into which requirements required for the product are classified; accepting technical information regarding a trouble; referring to the technical information regarding the trouble accepted in the accepting; selecting a classification item to which the trouble belongs from among the requirement classifications; selecting a classification item to which a element that has caused the trouble belongs from among the element classifications; and associating the classification item of the requirement classifications with the classification item of the element classifications with regard to the element classifications and the requirement classifications stored in a storage unit, the classification item having been selected in the selecting.

* * * * *